US007285442B2

(12) United States Patent
Moden et al.

(10) Patent No.: US 7,285,442 B2
(45) Date of Patent: Oct. 23, 2007

(54) STACKABLE CERAMIC FBGA FOR HIGH THERMAL APPLICATIONS

(75) Inventors: Walter L. Moden, Meridian, ID (US); David J. Corisis, Meridian, ID (US); Leonard E. Mess, Boise, ID (US); Larry D. Kinsman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 244 days.

(21) Appl. No.: 11/063,403

(22) Filed: Feb. 22, 2005

(65) Prior Publication Data

US 2005/0146010 A1    Jul. 7, 2005

Related U.S. Application Data

(60) Continuation of application No. 10/706,210, filed on Nov. 12, 2003, now Pat. No. 6,858,926, which is a division of application No. 09/924,635, filed on Aug. 8, 2001, now Pat. No. 6,650,007, which is a continuation of application No. 09/344,279, filed on Jun. 30, 1999, now Pat. No. 6,297,548.

(60) Provisional application No. 60/091,205, filed on Jun. 30, 1998.

(51) Int. Cl.
*H01L 21/00* (2006.01)

(52) U.S. Cl. ........................ 438/107; 438/112

(58) Field of Classification Search ................ 438/74, 438/107, 109, 112, 123, 613, FOR. 426; 257/686, E25.006, E25.013, E25.017, E25.027, 257/E23.085, E21.614
See application file for complete search history.

(56) References Cited

U.S. PATENT DOCUMENTS

| 4,143,456 A | 3/1979 | Inoue |
| 4,264,917 A | 4/1981 | Ugon |
| 4,300,153 A | 11/1981 | Hayakawn et al. |
| 4,323,914 A | 4/1982 | Berndlmaier et al. |
| 4,358,552 A | 11/1982 | Shinohara et al. |
| 4,507,675 A | 3/1985 | Fujii et al. |
| 4,642,671 A | 2/1987 | Rohsler et al. |
| 4,801,998 A | 1/1989 | Okuaki |
| 4,862,245 A | 8/1989 | Pashby et al. |
| 4,931,852 A | 6/1990 | Brown et al. |
| 4,961,107 A | 10/1990 | Geist et al. |
| 4,984,059 A | 1/1991 | Kubota et al. |
| 5,051,275 A | 9/1991 | Wong |
| 5,101,465 A | 3/1992 | Murphy |
| 5,108,955 A | 4/1992 | Ishida et al. |
| 5,111,278 A | 5/1992 | Eichelberger |
| 5,144,747 A | 9/1992 | Eichelberger |
| 5,173,764 A | 12/1992 | Higgins, III |
| 5,184,208 A | 2/1993 | Sakuta et al. |

(Continued)

FOREIGN PATENT DOCUMENTS

JP    52-77684    6/1977

(Continued)

*Primary Examiner*—Brook Kebede
*Assistant Examiner*—Khiem D Nguyen
(74) *Attorney, Agent, or Firm*—TraskBritt, PC

(57) ABSTRACT

An apparatus package for high-temperature thermal applications for ball grid array semiconductor devices and a method of packaging ball grid array semiconductor devices.

41 Claims, 5 Drawing Sheets

U.S. PATENT DOCUMENTS

| | | |
|---|---|---|
| 5,194,930 A | 3/1993 | Papathomas et al. |
| 5,218,759 A | 6/1993 | Juskey et al. |
| 5,241,456 A | 8/1993 | Marcinkiewicz et al. |
| 5,252,853 A | 10/1993 | Michii |
| 5,280,192 A | 1/1994 | Kryzaniwsky |
| 5,286,679 A | 2/1994 | Farnworth et al. |
| 5,304,842 A | 4/1994 | Farnworth et al. |
| 5,311,060 A | 5/1994 | Rostoker et al. |
| 5,344,795 A | 9/1994 | Hashemi et al. |
| 5,379,186 A | 1/1995 | Gold et al. |
| 5,394,303 A | 2/1995 | Yamaji |
| 5,434,105 A | 7/1995 | Liou |
| 5,436,203 A | 7/1995 | Lin |
| 5,440,169 A | 8/1995 | Tomita et al. |
| 5,441,684 A | 8/1995 | Lee |
| 5,450,283 A | 9/1995 | Lin et al. |
| 5,461,255 A | 10/1995 | Chan et al. |
| 5,488,254 A | 1/1996 | Nishimura et al. |
| 5,489,538 A | 2/1996 | Rostoker et al. |
| 5,489,801 A | 2/1996 | Blish, II |
| 5,552,635 A | 9/1996 | Kim et al. |
| 5,598,034 A | 1/1997 | Wakefield |
| 5,604,376 A | 2/1997 | Hamburgen et al. |
| 5,633,530 A * | 5/1997 | Hsu ................... 257/685 |
| 5,641,997 A | 6/1997 | Ohta et al. |
| 5,652,461 A | 7/1997 | Ootssuki et al. |
| 5,656,857 A | 8/1997 | Kishita |
| 5,659,952 A | 8/1997 | Kovac et al. |
| 5,701,233 A | 12/1997 | Carson et al. |
| 5,754,408 A | 5/1998 | Derouiche |
| 5,814,885 A * | 9/1998 | Pogge et al. ................. 257/730 |
| 5,866,953 A | 2/1999 | Akram et al. |
| 6,013,948 A | 1/2000 | Akram et al. |
| 6,137,163 A * | 10/2000 | Kim et al. ................... 257/686 |
| 6,188,127 B1 | 2/2001 | Senba et al. |
| 6,297,548 B1 | 10/2001 | Moden et al. |
| 6,313,522 B1 | 11/2001 | Akram et al. |
| 6,501,165 B1 | 12/2002 | Farnworth et al. |
| 6,650,007 B2 | 11/2003 | Moden et al. |

FOREIGN PATENT DOCUMENTS

| | | |
|---|---|---|
| JP | 55-128835 | 10/1980 |
| JP | 56-4241 | 1/1981 |
| JP | 60-94744 | 5/1985 |
| JP | 60-178651 | 9/1985 |
| JP | 62-109326 | 5/1987 |
| JP | 62-115834 | 5/1987 |
| JP | 62-261133 | 11/1987 |
| JP | 2-306639 | 12/1990 |
| JP | 4-157758 | 5/1992 |

* cited by examiner

STACKABLE CERAMIC FBGA FOR HIGH THERMAL APPLICATIONS

CROSS-REFERENCE TO RELATED APPLICATIONS

This application is a continuation of application Ser. No. 10/706,210, filed Nov. 12, 2003, now U.S. Pat. No. 6,858,926, issued Feb. 22, 2005, which is a divisional of application Ser. No. 09/924,635, filed Aug. 8, 2001, now U.S. Pat. No. 6,650,007, issued Nov. 18, 2003, which is a continuation of application Ser. No. 09/344,279, filed Jun. 30, 1999, now U.S. Pat. No. 6,297,548, issued Oct. 2, 2001, which claims the benefit of U.S. Provisional Application No. 60/091,205 filed Jun. 30, 1998.

BACKGROUND OF THE INVENTION

1. Statement of the Invention

The present invention relates to an apparatus for high-temperature thermal applications for ball grid array semiconductor devices and a method of packaging ball grid array semiconductor devices.

2. State of the Art

Integrated semiconductor devices are typically constructed in wafer form with each device having the form of an integrated circuit die which is typically attached to a lead frame with gold wires. The die and lead frame are then encapsulated in a plastic or ceramic package, which is then commonly referred to as an integrated circuit (IC). ICs come in a variety of forms, such as a dynamic random access memory (DRAM), static random access memory (SRAM), read only memory (ROM), gate arrays, etc. The ICs are interconnected in many combinations on printed circuit boards by a number of techniques, such as socketing and soldering. Interconnection among ICs arrayed on a printed circuit board is typically made by conductive traces formed by photolithography and etching processes.

Such semiconductor devices typically take the form of the semiconductor die therein. The die is generally electrically attached to a lead frame within a package. The lead frame physically supports the die and provides electrical connections between the die and its operating environment. The die is generally electrically attached to the lead frame by means of fine gold wires. These fine gold wires function to connect the die to the lead frame so that the gold wires are connected electrically in series with the lead frame leads. The lead frame and die are then encapsulated. The packaged chip is then able to be installed on a circuit board by any desired manner, such as soldering, socketing, etc.

However, as the speed of the semiconductor die increases, the heat generated during operation increases. Additionally, it becomes necessary to shorten the leads between the printed circuit board on which the IC is located and the IC device itself in order to keep the impedance of the circuit from affecting the response speed of the IC device.

The wires connecting the leads of the lead frame to the bond pads on the active surface of the semiconductor die in an IC package are not an effective connection for high operating speed semiconductor dice as the wires slow down the response of the semiconductor die.

Therefore, a packaging is required for semiconductor dice which have high operating speeds and generate heat associated therewith while minimizing the lead length between the semiconductor dice and the printed circuit boards on which they are mounted.

BRIEF SUMMARY OF THE INVENTION

The present invention comprises an apparatus package for high-temperature thermal applications for ball grid array semiconductor devices and a method of packaging ball grid array semiconductor devices.

The present invention will be better understood when the drawings are taken in conjunction with the description of the invention.

DETAILED DESCRIPTION OF THE INVENTION

Figure 1:
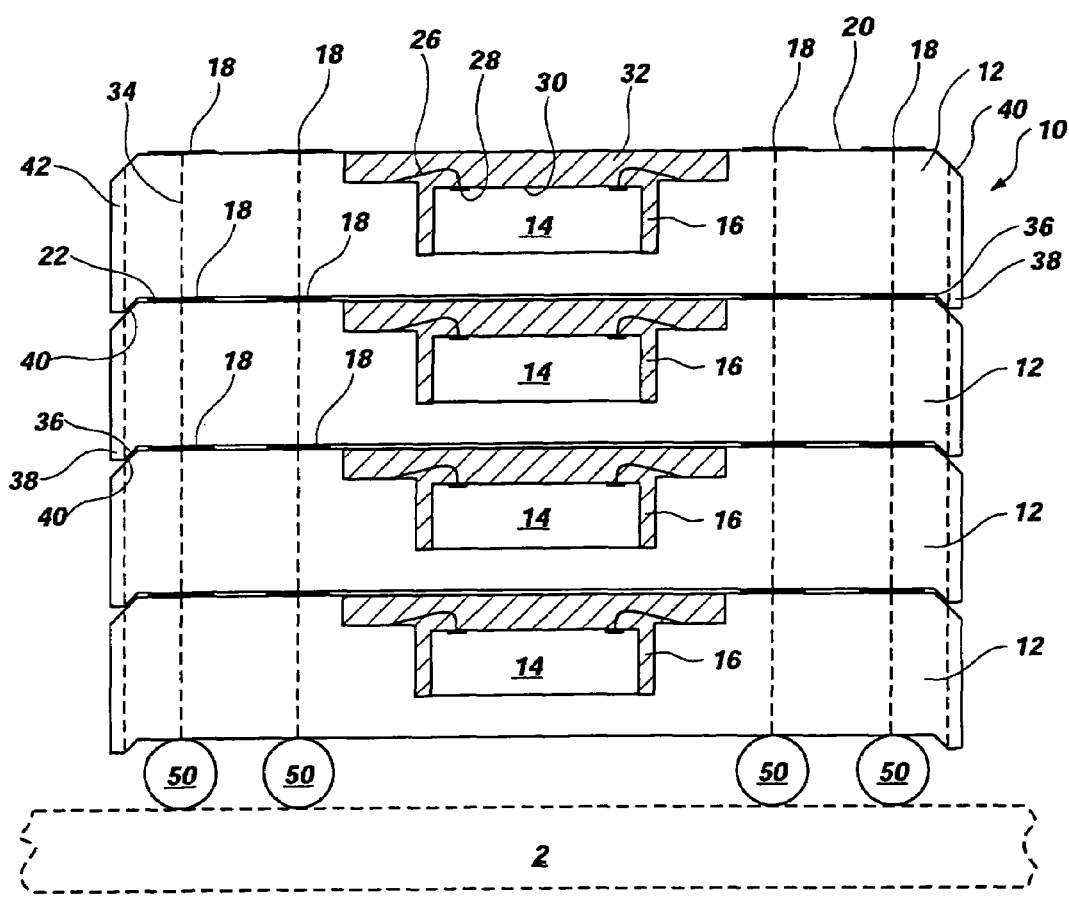
FIG. 1 is a cross-sectional view of a stack of a first embodiment of the packaged semiconductor dice of the present invention on a printed circuit board.

Referring to drawing FIG. 1, a plurality of assemblies 10 comprising a carrier 12 and a semiconductor device 14 located therein is illustrated installed on a substrate 2. Each carrier 12 comprises a member having a cavity 16 therein. As illustrated, the cavity 16 may be a single-level or multi-level cavity having any desired number of levels therein. The carrier 12 is formed having a plurality of contact pads 18 located on the upper surface 20 and lower surface 22 thereof which is connected by circuits 24 (not shown) and by wire bonds 26 to the bond pads 28 located on the active surface 30 of the semiconductor die or device 14. The semiconductor die or device 14 is initially retained within the cavity 16 by any suitable means, such as adhesive, etc. The circuits 24 (not shown) are formed on the upper surface 20 of the carrier 12 and portions of the walls or surfaces of the cavity 16 by any suitable well-known means, such as deposition and etching processes. The wire bonds 26 connecting the bond pads 28 of the semiconductor die or device 14 to the circuits 24 (not shown) are made using any suitable commercially available wire bonder. After the wire bonds 26 are formed, the cavity 16 is filled with suitable encapsulant material 32 covering and sealing the semiconductor die 14 in the cavity 16 and sealing the wire bonds 26 in position therein.

The carriers 12 may be of any desired geometric shape. The carrier 12 is formed having internal circuits 34 extending between the contact pads 18 on the upper surface 20 and lower surface 22 of the carrier 12. The carrier 12 is formed having frustoconical recess surfaces 36, lips 38, and frustoconical surfaces 40 on the upper surface 20. The surfaces 36 and 40 are formed having complementary angles so that the surfaces 36 and lips 38 of an adjacent carrier 12 mate or nest with an adjacent carrier 12 having surfaces 40 thereon, thereby forming a stable, self-aligning stack of carriers 12.

If desired, the carriers 12 may be formed having a plurality of heat transfer fins 42 thereon. The carrier 12 may be formed of any desired suitable material, such as ceramic material, high-temperature plastic material, etc. The carrier 12 may be formed by any suitable method, such as molding, extrusion, etc.

Once a plurality of carriers 12 having semiconductor die or devices 14 therein is formed as an assembly, the assembly is connected to the substrate 2 using a plurality of reflowed solder balls 50. The substrate 2 includes circuitry thereon, on either the upper surface or lower surface or both, and therein, as well as conductive vias, if desired. The substrate 2 may be any suitable substrate, such as a printed circuit board, FR-4 board, etc. Any desired number of carriers 12 may be stacked to form an assembly on the substrate 2. As illustrated, the reflowed solder balls 50 are located in alignment with the contact pads 18 and the connecting internal circuits 34 extending between the contact pads 18 on the upper surface 20 and lower surface 22 of a carrier 12.

Figure 2:
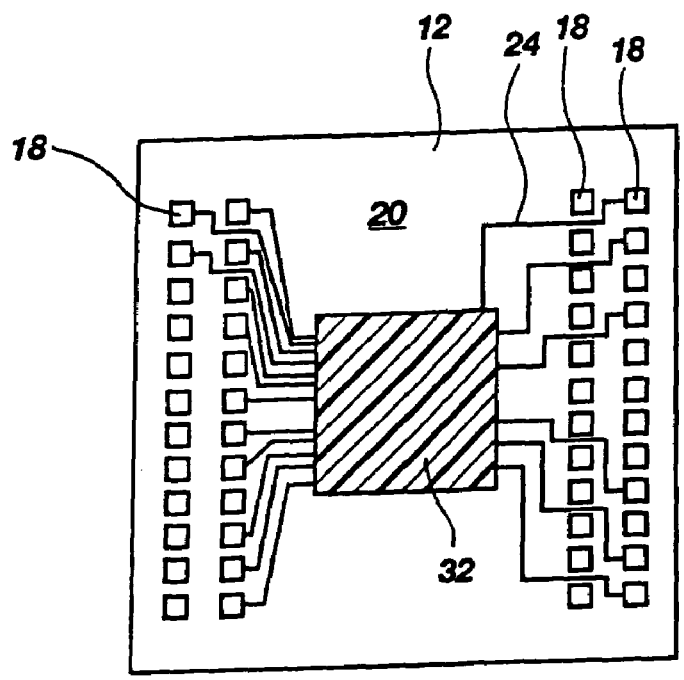
FIG. 2 is a top view of a packaged semiconductor die of the present invention.

Referring to drawing FIG. 2, a carrier 12 having circuits 24 thereon extending between contact pads 18 on the upper surface 20 of the carrier 12 is illustrated. For purposes of clarity, only a portion of the circuits 24 extending on the upper surface 20 of the carrier 12 is illustrated.

Figure 3:
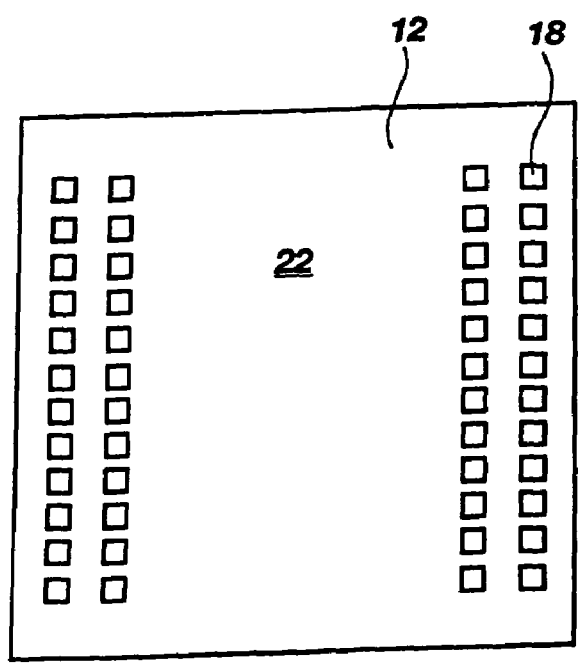
FIG. 3 is a bottom view of a packaged semiconductor die of the present invention.

Referring to drawing FIG. 3, the lower surface 22 of a carrier 12 is illustrated having a plurality of contact pads 18 located thereon.

Figure 4:
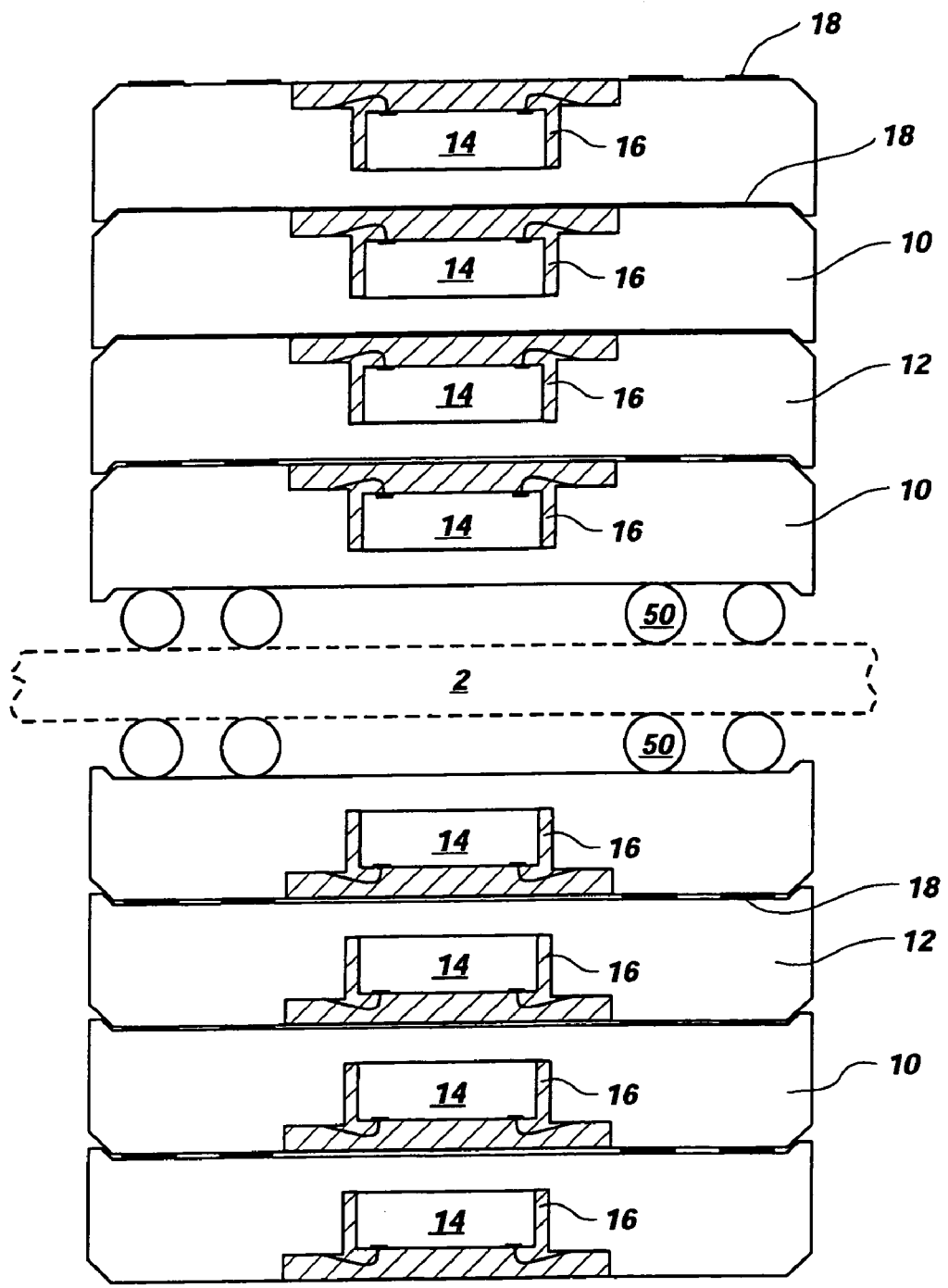
FIG. 4 is a cross-sectional view of stacks of the packaged semiconductor dice of the present invention on both sides of a printed circuit board.

Referring to drawing FIG. 4, a plurality of assemblies 10 is illustrated located on both sides of a substrate 2 being connected to the circuitry thereon by a plurality of reflowed solder balls 50.

Figure 5:
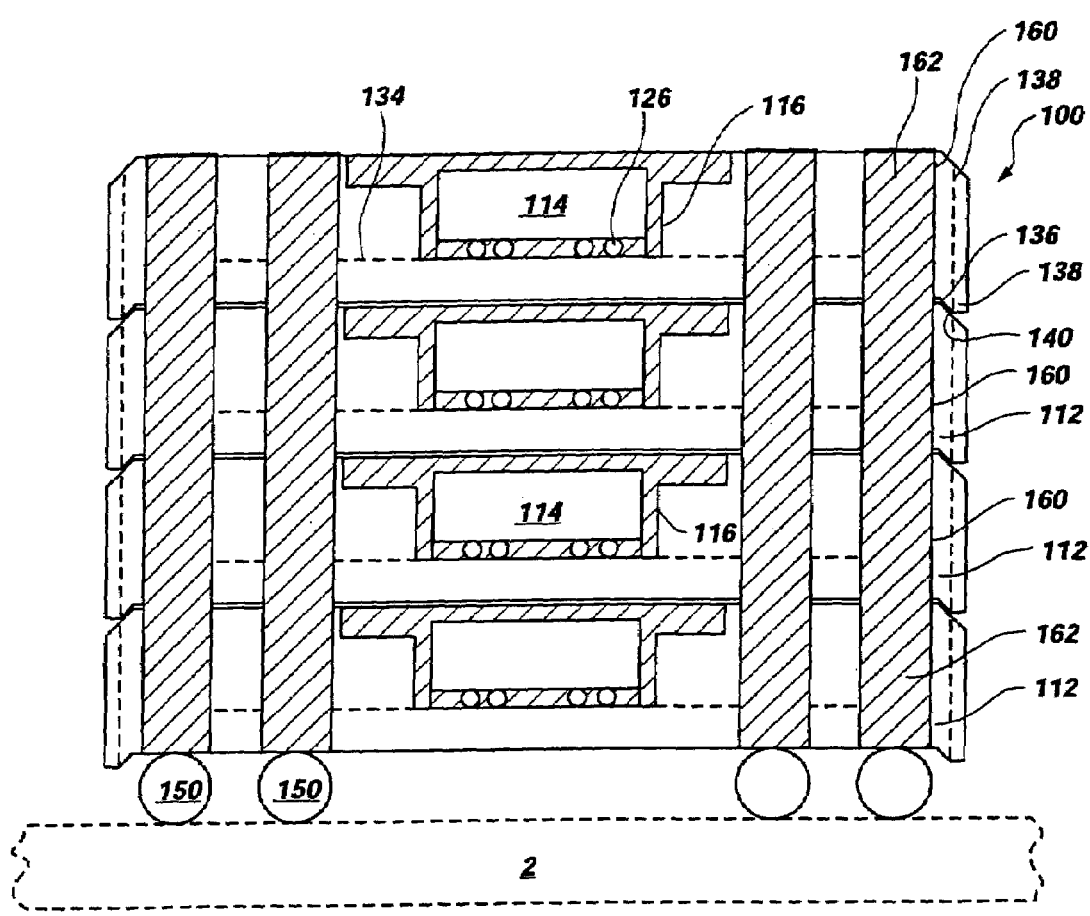
FIG. 5 is a cross-sectional view of a stack of a second embodiment of the packaged semiconductor die of the present invention on a printed circuit board.

Referring to drawing FIG. 5, a second embodiment of the present invention is illustrated. A plurality of assemblies 100 is stacked on a substrate 2, being electrically and mechanically connected thereto by reflowed solder balls 150. Each assembly 100 comprises a carrier 112 having a cavity 116 therein containing a semiconductor die or device 114 therein. The semiconductor die or device 114 is electrically connected to the circuits 134 of the carrier 112 by reflowed solder balls 126. Each carrier 112 is formed having apertures 160 therethrough connecting with circuits 134. Each carrier 112 is formed with surfaces 136 and 140 as well as lips 138 as described hereinbefore with respect to carrier 12. To connect each carrier 112 to an adjacent carrier 112, a conductive material 162, such as conductive epoxy, solder, etc., is used to fill the apertures 160 in the carriers and contact the conductive material 162 in adjacent carriers 112.

The carriers 112 are similar in construction to the carriers 12 as described hereinbefore, except for the apertures 160, conductive material 162, circuits 134, and reflowed solder balls 126 between the semiconductor die or device 114 and the circuits 134.

The substrate 2 is the same as described hereinbefore.

Figure 6:
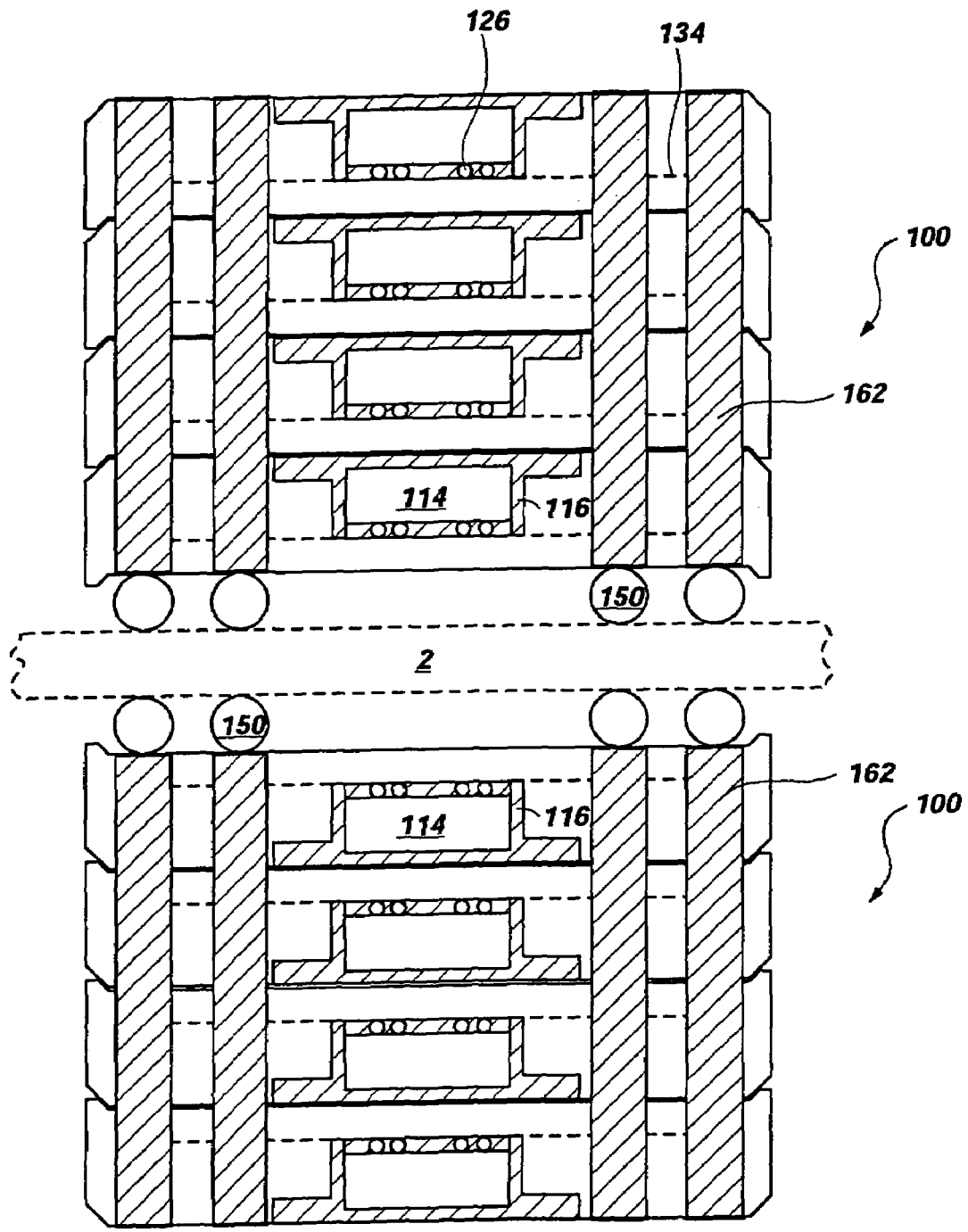
FIG. 6 is a cross-sectional view of stacks of the second embodiment of the present invention on both sides of a printed circuit board.

Referring to drawing FIG. 6, a plurality of assemblies 100 is illustrated stacked on both sides of a substrate 2, being electrically and mechanically connected thereto by reflowed solder balls 150.

The present invention includes additions, deletions, modifications, and alterations which are within the scope of the claims.

What is claimed is:

1. A method for forming an assembly comprising:
  obtaining a first carrier having a plurality of sides and a cavity, a frustoconical surface on a portion of each side of the plurality of sides for nesting with a second assembly, a lip on a portion of a bottom surface of each side of the plurality of sides for nesting with a third assembly, and a plurality of circuits located in a portion of the cavity;
  placing a semiconductor device having a plurality of bond pads located within the cavity of the first carrier;
  forming a first connector between at least one circuit of the plurality of circuits located in the portion of the cavity of the first carrier and at least one bond pad of the plurality of bond pads of the semiconductor device;
  filling a portion of the cavity in the first carrier using an encapsulant material; and
  placing a second connector material located in the first carrier.

2. The method of claim 1, further comprising:
  providing a substrate having an upper surface, a lower surface, and a plurality of circuits on the upper surface thereof; and
  forming at least one second connector connected to the second connector material in the first carrier and at least one circuit of the plurality of circuits on the upper surface of the substrate.

3. The method of claim 1, wherein the first carrier includes at least one fin on a portion thereof.

4. The method of claim 1, further comprising:
  providing a second carrier oriented with respect to the first carrier and positioned in the same direction as the first carrier and further having a cavity therein, an upper surface, a lower surface, at least one aperture therethrough, and a plurality of circuits located in a portion of the cavity thereon connected to the at least one aperture therethrough;
  placing a second semiconductor device having an active surface having a plurality of bond pads thereon, the second semiconductor device located within the cavity of the second carrier;
  forming another first connector between at least one circuit of the plurality of circuits located in the portion of the cavity of the second carrier and at least one bond pad of the plurality of bond pads on the active surface of the second semiconductor device located within the cavity of the second carrier;
  filling the portion of the cavity in the second carrier using an encapsulant material; and
  placing connector material located in a second aperture in the second carrier connected to the second connector material in the first carrier.

5. An assembly method comprising: forming a first carrier having a plurality of sides, an upper surface, a lower surface, a cavity, a frustoconical surface on a portion of each side of the plurality of sides for nesting with a second assembly, a lip on a portion of a bottom surface of each side of the plurality of sides for nesting with a third assembly, a plurality of circuits located in a portion of the cavity, at least one circuit of the plurality of circuits located in a portion of the cavity extending to at least one contact pad of a plurality of contact pads on the upper surface, a plurality of contact pads on the lower surface, and a plurality of internal circuits extending between at least one of the plurality of contact pads on the upper surface and at least one of the plurality of contact pads on the lower surface;
  locating a semiconductor device having a plurality of bond pads located within the cavity of the first carrier; and
  forming a first connector between at least one circuit of the plurality of circuits located in the portion of the cavity of the first carrier and at least one bond pad of the plurality of bond pads of the semiconductor device.

6. The method of claim 5, further comprising: filling a portion of the cavity in the first carrier using an encapsulant material.

7. The method of claim 5, further comprising:
providing a substrate having an upper surface, a lower surface, and a plurality of circuits on the upper surface thereof; and
attaching the first carrier to the substrate by forming at least one second connector connected to at least one contact pad of the plurality of contact pads on the lower surface of the first carrier and at least one circuit of the plurality of circuits on the upper surface of the substrate.

8. The method of claim 5, wherein the first carrier includes at least one fin on a portion thereof.

9. The method of claim 5, further comprising:
providing a second carrier oriented with respect to the first carrier and positioned in the same direction as the first carrier, the second carrier having an upper surface, a lower surface, a cavity, a first frustoconical surface on a portion thereof, a second frustoconical surface on another portion thereof, a lip on a portion of a bottom surface thereof, a plurality of circuits located in a portion of the cavity, at least one circuit of the plurality of circuits located in a portion of the cavity extending to at least one contact pad of a plurality of contact pads on the upper surface, a plurality of contact pads on the lower surface, and a plurality of internal circuits extending between at least one of the plurality of contact pads on the upper surface and at least one of the plurality of contact pads on the lower surface;
placing a second semiconductor device having an active surface having a plurality of bond pads thereon, the second semiconductor device located within the cavity of the second carrier; and
forming another first connector between at least one circuit of the plurality of circuits located in the portion of the cavity of the second carrier and at least one bond pad of the plurality of bond pads on the active surface of the second semiconductor device located within the cavity of the second carrier.

10. The method of claim 9, further comprising:
stacking the second carrier on the first carrier by forming at least one second connector connected to at least one contact pad of the plurality of contact pads on the lower surface of the first carrier and at least one circuit of the plurality of circuits on the upper surface of the second carrier.

11. The method of claim 10, further comprising:
filling the portion of the cavity in the second carrier using an encapsulant material.

12. An assembly method comprising:
forming a substrate having an upper surface, a lower surface, and a plurality of circuits on the upper surface thereof and a plurality of circuits on the lower surface thereof;
forming a first carrier having a plurality of sides, an upper surface, a lower surface, a cavity, a frustoconical surface on a portion of each side for nesting with a side of a second carrier, a lip on a portion of a bottom surface of each side for nesting with a surface of a third carrier, a plurality of circuits located in a portion of the cavity, at least one circuit of the plurality of circuits located in a portion of the cavity extending to at least one contact pad of a plurality of contact pads on the upper surface, a plurality of contact pads on the lower surface, and a plurality of internal circuits extending between at least one of the plurality of contact pads on the upper surface and at least one of the plurality of contact pads on the lower surface;
locating a semiconductor device having a plurality of bond pads located within the cavity of the first carrier;
forming a first connector between at least one circuit of the plurality of circuits located in the portion of the cavity of the first carrier and at least one bond pad of the plurality of bond pads of the semiconductor device; and
attaching the first carrier to the upper surface of the substrate by forming at least one second connector connected to at least one contact pad of the plurality of contact pads on the lower surface of the first carrier and at least one circuit of the plurality of circuits on the upper surface of the substrate.

13. The method of claim 12, further comprising:
filling a portion of the cavity in the first carrier using an encapsulant material.

14. The method of claim 12, further comprising:
providing a second carrier having an upper surface, a lower surface, a cavity, a first frustoconical surface on a portion thereof, a second frustoconical surface on another portion thereof, a lip on a portion of a bottom surface thereof, a plurality of circuits located in a portion of the cavity, at least one circuit of the plurality of circuits located in a portion of the cavity extending to at least one contact pad of a plurality of contact pads on the upper surface, a plurality of contact pads on the lower surface, and a plurality of internal circuits extending between at least one of the plurality of contact pads on the upper surface and at least one of the plurality of contact pads on the lower surface;
placing a second semiconductor device having an active surface having a plurality of bond pads thereon, the second semiconductor device located within the cavity of the second carrier;
forming another first connector between at least one circuit of the plurality of circuits located in the portion of the cavity of the second carrier and at least one bond pad of the plurality of bond pads on the active surface of the second semiconductor device located within the cavity of the second carrier; and
attaching the second carrier to the substrate by forming at least one second connector connected to at least one contact pad of the plurality of contact pads on the lower surface of the first carrier and at least one circuit of the plurality of circuits on the lower surface of the substrate.

15. The method of claim 12, further comprising:
providing a third carrier oriented with respect to the first carrier and positioned in the same direction as the first carrier, the third carrier having an upper surface, a lower surface, a cavity, a first frustoconical surface on a portion thereof, a second frustoconical surface on another portion thereof, a lip on a portion of a bottom surface thereof, a plurality of circuits located in a portion of the cavity, at least one circuit of the plurality of circuits located in a portion of the cavity extending to at least one contact pad of a plurality of contact pads on the upper surface, a plurality of contact pads on the lower surface, and a plurality of internal circuits extending between at least one of the plurality of contact pads on the upper surface and at least one of the plurality of contact pads on the lower surface;

placing a third semiconductor device having an active surface having a plurality of bond pads thereon, the third semiconductor device located within the cavity of the third carrier; and forming another first connector between at least one circuit of the plurality of circuits located in the portion of the cavity of the third carrier and at least one bond pad of the plurality of bond pads on the active surface of the third semiconductor device located within the cavity of the third carrier.

16. The method of claim 15, further comprising:

providing a fourth carrier oriented with respect to the second carrier and positioned in the same direction as the second carrier, the fourth carrier having an upper surface, a lower surface, a cavity, a first frustoconical surface on a portion thereof, a second frustoconical surface on another portion thereof, a lip on a portion of a bottom surface thereof, a plurality of circuits located in a portion of the cavity, at least one circuit of the plurality of circuits located in a portion of the cavity extending to at least one contact pad of a plurality of contact pads on the upper surface, a plurality of contact pads on the lower surface, and a plurality of internal circuits extending between at least one of the plurality of contact pads on the upper surface and at least one of the plurality of contact pads on the lower surface;

placing a fourth semiconductor device having an active surface having a plurality of bond pads thereon, the fourth semiconductor device located within the cavity of the fourth carrier; and forming another first connector between at least one circuit of the plurality of circuits located in the portion of the cavity of a second carrier and at least one bond pad of the plurality of bond pads on the active surface of the fourth semiconductor device located within the cavity of the fourth carrier.

17. The method of claim 12, wherein the first carrier includes at least one fin on a portion thereof.

18. The method of claim 15, further comprising:

stacking the third carrier on the first carrier by forming at least one second connector connected to at least one contact pad of the plurality of contact pads on the lower surface of the first carrier and at least one circuit of the plurality of circuits on the upper surface of the substrate.

19. The method of claim 16, further comprising:

stacking the fourth carrier on the second carrier by forming at least one second connector connected to at least one contact pad of the plurality of contact pads on the lower surface of the second carrier and at least one circuit of the plurality of circuits on the lower surface of the substrate.

20. A method for forming an assembly comprising:

forming a substrate having an upper surface, a lower surface, a plurality of circuits on the upper surface thereof, and a plurality of circuits on the lower surface thereof;

forming a first carrier having a plurality of sides, a cavity, a frustoconical surface on a portion of each side for nesting with a second carrier, a lip on a portion of a bottom surface of each side for nesting with a bottom surface of a third carrier, and a plurality of circuits located in a portion of the cavity;

placing a semiconductor device having a plurality of bond pads located within the cavity of the first carrier;

forming a first connector between at least one circuit of the plurality of circuits located in the portion of the cavity of the first carrier and at least one bond pad of the plurality of bond pads of the semiconductor device;

placing a second connector material located in the first carrier;

forming at least one second connector connected to the second connector material in the first carrier and at least one circuit of the plurality of circuits on the upper surface of the substrate.

21. The method of claim 20, further comprising:

providing a second carrier having a cavity therein, an upper surface, a lower surface, at least one aperture therethrough, and a plurality of circuits located in a portion of the cavity thereon connected to the at least one aperture therethrough;

placing a second semiconductor device having an active surface having a plurality of bond pads thereon, the second semiconductor device located within the cavity of the second carrier;

forming another first connector between at least one circuit of the plurality of circuits located in the portion of the cavity of the second carrier and at least one bond pad of the plurality of bond pads on the active surface of the second semiconductor device located within the cavity of the second carrier;

placing connector material located in a second aperture in the second carrier connected to a connector material in the at least one aperture in the second carrier; and attaching the second carrier to the lower surface of the substrate by forming at least one connector connected to at least one contact pad of a plurality of contact pads on the lower surface of the second carrier and at least one circuit of the plurality of circuits on the lower surface of the substrate.

22. The method of claim 21, further comprising:

providing a third carrier oriented with respect to the first carrier and positioned in the same direction as the first carrier and further having a cavity therein, an upper surface, a lower surface, at least one aperture therethrough, and a plurality of circuits located in a portion of the cavity thereon connected to the at least one aperture therethrough;

placing a third semiconductor device having an active surface having a plurality of bond pads thereon, the third semiconductor device located within the cavity of the third carrier;

forming another first connector between at least one circuit of the plurality of circuits located in the portion of the cavity of the third carrier and at least one bond pad of the plurality of bond pads on the active surface of the third semiconductor device located within the cavity of the third carrier;

filling the portion of the cavity in the third carrier using an encapsulant material; and placing connector material located in a second aperture in the third carrier connected to a connector material in the at least one aperture in the first carrier.

23. The method of claim 22, further comprising:

providing a fourth carrier oriented with respect to the third carrier and positioned in the same direction as the third carrier, the fourth carrier having a cavity therein, an upper surface, a lower surface, at least one aperture therethrough, and a plurality of circuits located in a portion of the cavity thereon connected to the at least one aperture therethrough;

placing a fourth semiconductor device having an active surface having a plurality of bond pads thereon, the fourth semiconductor device located within the cavity of the fourth carrier;

forming another first connector between at least one circuit of the plurality of circuits located in the portion of the cavity of the fourth carrier and at least one bond pad of the plurality of bond pads on the active surface of the fourth semiconductor device located within the cavity of the fourth carrier;

filling the portion of the cavity in the fourth carrier using an encapsulant material; and placing connector material located in a second aperture in the fourth carrier connected to the connector material in the at least one aperture in the third carrier.

24. A method of stacking a plurality of semiconductor devices using carriers for forming an assembly comprising:

forming a first carrier having a plurality of sides, a cavity, a frustoconical surface on a portion of each side for nesting with another side of a second carrier, a lip on a portion of a bottom surface of each side for nesting with a side of a third carrier, and a plurality of circuits located in a portion of the cavity;

placing a semiconductor device having a plurality of bond pads located within the cavity of the first carrier;

forming a first connector between at least one circuit of the plurality of circuits located in the portion of the cavity of the first carrier and at least one bond pad of the plurality of bond pads of the semiconductor device;

filling a portion of the cavity in the first carrier using an encapsulant material; and placing a second connector material located in the first carrier.

25. The method of claim 24, further comprising:

providing a substrate having an upper surface, a lower surface, and a plurality of circuits on the upper surface thereof; and forming at least one second connector connected to a connector material in a at least one aperture in the first carrier and at least one circuit of the plurality of circuits on the upper surface of the substrate.

26. The method of claim 24, wherein the first carrier includes at least one fin on a portion thereof.

27. The method of claim 24, further comprising:

providing a second carrier oriented with respect to the first carrier and positioned in the same direction as the first carrier and further having a cavity therein, an upper surface, a lower surface, at least one aperture therethrough, and a plurality of circuits located in a portion of the cavity thereon connected to the at least one aperture therethrough;

placing a second semiconductor device having an active surface having a plurality of bond pads thereon, the second semiconductor device located within the cavity of the second carrier;

forming another first connector between at least one circuit of the plurality of circuits located in the portion of the cavity of the second carrier and at least one bond pad of the plurality of bond pads on the active surface of the second semiconductor device located within the cavity of the second carrier;

filling the portion of the cavity in the second carrier using an encapsulant material; and placing connector material located in a second aperture in the second carrier connected to a connector material in the at least one aperture in the first carrier.

28. A method of stacking a plurality of semiconductor devices using carriers for forming an assembly comprising:

forming a first carrier having a plurality of sides, an upper surface, a lower surface, a cavity, a frustoconical surface on a portion of each side for nesting with another side of a second carrier, a lip on a portion of a bottom surface for nesting with another surface of a third carrier, a plurality of circuits located in a portion of the cavity, at least one circuit of the plurality of circuits located in a portion of the cavity extending to at least one contact pad of a plurality of contact pads on the upper surface, a plurality of contact pads on the lower surface, and a plurality of internal circuits extending between at least one of the plurality of contact pads on the upper surface and at least one of the plurality of contact pads on the lower surface;

locating a semiconductor device having a plurality of bond pads located within the cavity of the first carrier; and forming a first connector between at least one circuit of the plurality of circuits located in the portion of the cavity of the first carrier and at least one bond pad of the plurality of bond pads of the semiconductor device.

29. The method of claim 28, further comprising:

filling a portion of the cavity in the first carrier using an encapsulant material.

30. The method of claim 28, further comprising:

providing a substrate having an upper surface, a lower surface, and a plurality of circuits on the upper surface thereof; and attaching the first carrier to the substrate by forming at least one second connector connected to at least one contact pad of the plurality of contact pads on the lower surface of the first carrier and at least one circuit of the plurality of circuits on the upper surface of the substrate.

31. The method of claim 28, wherein the first carrier includes at least one fin on a portion thereof.

32. The method of claim 28, further comprising:

providing a second carrier oriented with respect to the first carrier and positioned in the same direction as the first carrier, the second carrier having an upper surface, a lower surface, a cavity, a first frustoconical surface on a portion thereof, a second frustoconical surface on another portion thereof, a lip on a portion of a bottom surface thereof, a plurality of circuits located in a portion of the cavity, at least one circuit of the plurality of circuits located in a portion of the cavity extending to at least one contact pad of a plurality of contact pads on the upper surface, a plurality of contact pads on the lower surface, and a plurality of internal circuits extending between at least one of the plurality of contact pads on the upper surface and at least one of the plurality of contact pads on the lower surface;

placing a second semiconductor device having an active surface having a plurality of bond pads thereon, the second semiconductor device located within the cavity of the second carrier; and forming another first connector between at least one circuit of the plurality of circuits located in the portion of the cavity of the second carrier and at least one bond pad of the plurality of bond pads on the active surface of the second semiconductor device located in the cavity of the second carrier.

33. The method of claim 32, further comprising:

stacking the second carrier on the first carrier by forming at least one second connector connected to at least one contact pad of the plurality of contact pads on the lower surface of the first carrier and at least one circuit of the plurality of circuits on the upper surface of the substrate.

34. The method of claim 33, further comprising:
filling the portion of the cavity in the second carrier using an encapsulant material.

35. A method for stacking a plurality of semiconductor devices using carriers for forming an assembly comprising:
obtaining a substrate having an upper surface, a lower surface, and a plurality of circuits on the upper surface thereof and a plurality of circuits on the lower surface thereof;
obtaining a first carrier having a plurality of sides, an upper surface, a lower surface, a cavity, a frustoconical surface on a portion of each side for nesting with a portion of a side of a second carrier, a lip on a portion of a bottom surface of each side for nesting with a portion of a surface of a third carrier, a plurality of circuits located in a portion of the cavity, at least one circuit of the plurality of circuits located in a portion of the cavity extending to at least one contact pad of a plurality of contact pads on the upper surface, a plurality of contact pads on the lower surface, and a plurality of internal circuits extending between at least one of the plurality of contact pads on the upper surface and at least one of the plurality of contact pads on the lower surface;
locating a semiconductor device having a plurality of bond pads located within the cavity of the first carrier;
forming a first connector between at least one circuit of the plurality of circuits located in the portion of the cavity of the first carrier and at least one bond pad of the plurality of bond pads of the semiconductor device; and
attaching the first carrier to the upper surface of the substrate by forming at least one second connector connected to at least one contact pad of the plurality of contact pads on the lower surface of the first carrier and at least one circuit of the plurality of circuits on the upper surface of the substrate.

36. The method of claim 35, further comprising:
filling a portion of the cavity in the first carrier using an encapsulant material.

37. The method of claim 35, further comprising:
providing a second carrier having an upper surface, a lower surface, a cavity, a first frustoconical surface on a portion thereof, a second frustoconical surface on another portion thereof, a lip on a portion of a bottom surface thereof, a plurality of circuits located in a portion of the cavity, at least one circuit of the plurality of circuits located in a portion of the cavity extending to at least one contact pad of a plurality of contact pads on the upper surface, a plurality of contact pads on the lower surface, and a plurality of internal circuits extending between at least one of the plurality of contact pads on the upper surface and at least one of the plurality of contact pads on the lower surface;
placing a second semiconductor device having an active surface having a plurality of bond pads thereon, the second semiconductor device located within the cavity of the second carrier;
forming another first connector between at least one circuit of the plurality of circuits located in the portion of the cavity of the second carrier and at least one bond pad of the plurality of bond pads on the active surface of the second semiconductor device located in the cavity of the second carrier; and
attaching the second carrier to the substrate by forming at least one second connector connected to at least one contact pad of the plurality of contact pads on the lower surface of the second carrier and at least one circuit of the plurality of circuits on the lower surface of the substrate.

38. The method of claim 37, further comprising:
providing a third carrier oriented with respect to the first carrier and positioned in the same direction as the first carrier, the third carrier having an upper surface, a lower surface, a cavity, a first frustoconical surface on a portion thereof, a second frustoconical surface on another portion thereof, a lip on a portion of a bottom surface thereof, a plurality of circuits located in a portion of the cavity, at least one circuit of the plurality of circuits located in a portion of the cavity extending to at least one contact pad of a plurality of contact pads on the upper surface, a plurality of contact pads on the lower surface, and a plurality of internal circuits extending between at least one of the plurality of contact pads on the upper surface and at least one of the plurality of contact pads on the lower surface;
placing a third semiconductor device having an active surface having a plurality of bond pads thereon, the third semiconductor device located within the cavity of the third carrier; and
forming another first connector between at least one circuit of the plurality of circuits located in the portion of the cavity of the third carrier and at least one bond pad of the plurality of bond pads on the active surface of the third semiconductor device located in the cavity of the third carrier.

39. The method of claim 38, further comprising:
providing a fourth carrier oriented with respect to the second carrier and positioned in the same direction as the second carrier, the fourth carrier having an upper surface, a lower surface, a cavity, a first frustoconical surface on a portion thereof, a second frustoconical surface on another portion thereof, a lip on a portion of a bottom surface thereof, a plurality of circuits located in a portion of the cavity, at least one circuit of the plurality of circuits located in a portion of the cavity extending to at least one contact pad of a plurality of contact pads on the upper surface, a plurality of contact pads on the lower surface, and a plurality of internal circuits extending between at least one of the plurality of contact pads on the upper surface and at least one of the plurality of contact pads on the lower surface;
placing a fourth semiconductor device having an active surface having a plurality of bond pads thereon, the fourth semiconductor device located within the cavity of the fourth carrier; and
forming another first connector between at least one circuit of the plurality of circuits located in the portion of the cavity of the second carrier and at least one bond pad of the plurality of bond pads on the active surface of the fourth semiconductor device located within the cavity of the fourth carrier.

40. The method of claim 38, further comprising:
stacking the third carrier on the first carrier by forming at least one second connector connected to at least one contact pad of the plurality of contact pads on the lower surface of the first carrier and at least one circuit of the plurality of circuits on the upper surface of the substrate.

41. The method of claim 39, further comprising:

stacking the fourth carrier on the second carrier by forming at least one second connector connected to at least one contact pad of the plurality of contact pads on the lower surface of the second carrier and at least one circuit of the plurality of circuits on the lower surface of the substrate.

* * * * *